US006288947B1

(12) United States Patent
Kim et al.

(10) Patent No.: US 6,288,947 B1
(45) Date of Patent: Sep. 11, 2001

(54) DATA OUTPUT APPARATUS GUARANTEEING COMPLETE DATA TRANSFER USING DELAYED TIME IN MEMORY DEVICE HAVING PIPELATCH CIRCUITS

(75) Inventors: Kwan-Weon Kim; Dong-Sik Jeong, both of Ichon-shi (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/604,687

(22) Filed: Jun. 27, 2000

(30) Foreign Application Priority Data

Jun. 28, 1999 (KR) .................................. 99-24823

(51) Int. Cl.[7] ...................................................... G11C 7/10
(52) U.S. Cl. ........................................ 365/189.05; 365/194
(58) Field of Search ............................ 365/189.05, 194, 365/233

(56) References Cited

U.S. PATENT DOCUMENTS

| 5,404,338 | 4/1995 | Murai et al. ........................ 365/233 |
| 5,761,138 | 6/1998 | Lee et al. ............................ 365/200 |
| 5,896,340 | 4/1999 | Wong et al. ..................... 365/230.03 |
| 5,920,511 | * 7/1999 | Lee et al. ........................ 365/189.05 |
| 5,928,373 | 7/1999 | Yoo ..................................... 714/719 |
| 5,959,918 | 9/1999 | Arimoto ............................. 365/205 |
| 6,011,751 | 1/2000 | Hirabayashi ........................ 365/236 |
| 6,154,393 | * 11/2000 | Otsuka et al. .................. 365/189.02 |

FOREIGN PATENT DOCUMENTS

| 4-205996 | 7/1992 | (JP) | .............................. G11C/11/41 |
| 10199292 | 7/1998 | (JP) | .............................. G11C/29/00 |
| 11195296 | 7/1999 | (JP) | ............................. G11C/11/413 |
| 11213668 | 8/1999 | (JP) | ............................. G11C/11/407 |
| 11265581 | 9/1999 | (JP) | ............................. G11C/11/413 |

\* cited by examiner

*Primary Examiner*—Andrew Q. Tran
(74) *Attorney, Agent, or Firm*—Jacobson Holman, PLLC

(57) ABSTRACT

A memory device having a plurality of pipelatch circuits storing data from memory cells via global input/output lines, a pipelatch input control circuit to selectively couple the pipelatch circuit to the global input/output lines in response to a pipelatch control signal, and a pipe count signal generator to control a data path between the pipelatch circuits and an output driver, wherein the pipelatch input control circuit includes: a first control signal generator receiving a first control signal and global input/output line signals and producing a pass gate control signal; a second control signal generator receiving the first control signal and the pass gate control signal and producing a plurality of second control signals; a third control signal generator receiving the pass gate control signal and producing a third control signal by combining the pass gate control signal and a delay signal of the pass gate control signal; and a fourth control signal generator receiving the first control signal, the plurality of second control signals and the third control signal and producing the pipelatch control signal.

5 Claims, 6 Drawing Sheets

DATA OUTPUT APPARATUS GUARANTEEING COMPLETE DATA TRANSFER USING DELAYED TIME IN MEMORY DEVICE HAVING PIPELATCH CIRCUITS

FIELD OF THE INVENTION

The present invention relates to a DDR (Double Data Rate) synchronous DRAM; and, more particularly, to an apparatus and a method for controlling pipelatch input signals during a read operation in the DDR SDRAM.

DESCRIPTION OF THE PRIOR ARTS

As well-known to those skilled in the art to which the subject matter pertains, synchronous DRAMs, which are synchronized with external system clock signals, have been widely used to increase the speed thereof. Synchronous DRAMs (hereinafter, referred to as SDRAMS) are synchronized with a rising edge of the external system clock signal, but DDR SDRAMs are synchronized with both rising and falling edges of the external clock signal. Therefore, the DDR SDRAMs may increase operation speed twice as fast as SDRAMs without increasing frequency of the clock signals so that they are focused on the next generation DRAM devices. Furthermore, to process data continuously read out from memory cells, a plurality of pipeline latch circuits have been used in the SDRAMs.

FIG. 1 is a block diagram illustrating a data output path in a wave pipeline in which a plurality of pipelatch circuits to temporarily store cell data are arranged in parallel.

Referring to FIG. 1, four pipelatch circuits 30 to 33 are connected in parallel to global input/output lines gio<0> and /gio<0>. A data output unit 130 outputs data transferred through the global input/output lines gio<0> and /gio<0>, the pipelatch circuits 30 to 33, and an output driver 131 in response to pipelatch control signals pcd (<0> to <3>) and pipe count signals pcnt (<0> to <3>). A pipelatch control signal generator 150 produces the pipelatch control signal pcd which selectively couples the pipelatch circuits 30 to 33 to the global input/output lines gio<0> and /gio<0>. Global input/output units 110 to 113 are provided between a cell array block and the data output unit 130 to transfer the cell data read out from the cell array block. A pipe count signal generator 170, which produces the pipe count signal pcnt, selectively couples the pipelatch circuits 30 to 33 to the output driver 131.

The data output unit 130 also includes first switching means 20 to 23 in order to selectively connect the global input/output lines gio<0> and /gio<0> to the pipelatch circuits 30 to 33 in response to the pipelatch control signals pcd and second switching means 40 to 43 in order to selectively connect the pipelatch circuits 30 to 33 to the output driver 131 in response to the pipe count signals pcnt.

The global input/output units 110 to 113 includes a plurality of input/output sense amplifiers (IOSAs) to transfer amplified data to the global input/output lines gio<0> and /gio<0> and a precharging unit to precharge the global input/output lines gio<0> and /gio<0> to a power supply voltage VCC. It should be noted that each of global input/output units 110 to 113 is coupled to the data output unit 130 even if only the global input/output unit 110 is coupled to the data output unit 130 in FIG. 1.

FIG. 2 is a block diagram of the pipelatch control signal generator 150 in FIG. 1. The pipelatch control signal generator 150 includes a pass gate control signal generator 330, which produces a pass gate signal pcdinc by combining the global input/output lines signals gio<0:3> and /gio<0:3> and a pipelatch enable signal pcden, and a pipelatch selection signal generator 350 which produces the pipelatch control signals pcd<0>, pcd<1>, pcd<2> and pcd<3> to select one of the pipelatch circuits 30 to 33 in response to the pass gate signal pcdinc and the pipelatch enable signal pcden.

The pipelatch selection signal generator 350 includes a first circuit unit 360 and a second circuit unit 370. The first circuit unit 360 includes first pass transistors P10, P11, P12 and P13 controlled by the pass gate signal pcdinc and second pass transistors P20, P21, P22 and P23 controlled by an inverted signal of the pass gate signal pcdinc. At nodes N30 to N33, output signals of the first circuit unit 360 are produced by latch and buffer circuits which combine the pipelatch enable signal pcden and output signals from the second pass transistors P20, P21, P22 and P23. The second circuit unit 370 outputs the pipelatch control signals pcd<0>, pcd<>, pcd<2> and pcd<3> using the output signals from the first circuit unit 360 and the pipelatch enable signal pcden.

FIGS. 3 and 4 are timing charts illustrating the wave pipeline having a plurality of pipelatch circuits and the pipelatch control signal generator in FIGS. 1 and 2, respectively. In a first read operation, one of the global input/output lines gio<0> and /gio<0>, which are precharged by the precharging unit, goes from a high voltage level to a low voltage level when the input/output sense amplifier (IOSA) in one of the global input/output units 110 to 113 is turned on and the data from the memory cell block are transferred thereto. At this time, the first switching means 20 is turned on by the pipelatch control signal pcd<0> from the pipelatch control signal generator 150.

After the data are stored in the pipelatch circuit 30 for a predetermined time, a global input/output line precharge signal gio_precharge is activated in a low voltage level and the global input/output lines gio<0> and /gio<0> are precharged to a high voltage level. When the global input/output lines gio<0> and /gio<0> are precharged to a high voltage level, the pass gate signal pcdinc from the pass gate control signal generator 330 is in a high voltage level in response to the precharged global input/output lines gio<0> and /gio<0>, a signal at node N30 is in a low voltage level, and then the first switching means 20 is disabled by the pipelatch control signal pcd<0> which is in a high voltage level in response to the signal at node N30 and the pipelatch enable signal pcden.

On the other hand, a signal at node N31 is in a high voltage level and the pipelatch control signal pcd<1> is in a low voltage level so that these signals makes the first switching means 21 enabled to form the data pass between the global input/output lines gio<0> and /gio<0> and the pipelatch circuit 31. Since the pipelatch control signal pcd<1> is enabled when the pipelatch control signal pcd<0> is disabled, it should be noted that the data path between the global input/output lines gio<0> and /gio<0> and the pipelatch circuit 30 is turned on and the data path between the global input/output lines gio<0> and /gio<0> and the pipelatch circuit 31 is turned off simultaneously.

In like manner, one of the input/output sense amplifiers is selected in another read operation, the cell data are stored in the pipelatch circuit 31 through the above-mentioned procedures and the switching means 21 is disabled by the pipelatch control signal pcd<1> which is in a high voltage level. The third and fourth read operations are carried out by the pipelatch circuits 32 and 33, respectively. The data stored in the pipelatch circuits 30 to 33 are output through the output driver 131 in response to the pipe count signals pcnt<0:3>.

However, the above-mentioned read operation using the pipelatch circuits has some drawbacks because the distance between the input/output sense amplifier IOSA and the pipelatch circuits 30 to 33 is not constant. That is, since the data transferred by the input/output sense amplifier IOSA, which is far away from the pipelatch circuit, has a low transmission rate and a narrow bandwidth, the data skew may occur based on the position of the input/output sense amplifiers IOSAs. This skew may occur in repeated read operations and especially, in highly integrated and high speed memory devices.

Furthermore, if the operating frequency is fast based on the high speed operation, two data can be interfered each other because the interval of time between the previous data and the next data becomes narrower and therefore the bandwidth is not constant due to the data skew. For example, if the next read operation is generated before the global input/output line is disconnected from the pipelatch circuit, misread data may be stored in the pipelatch circuit.

SUMMARY OF THE INVENTION

It is, therefore, an object of the present invention to provide an improved memory device executing a stable read operation in a high speed.

It is another object of the present invention to provide a memory device capable of preventing an error caused by the data skew and narrow bandwidth from being latched in pipelatch circuits in synchronous DRAMs.

In accordance with an aspect of the present invention, there is provided a memory device having a plurality of pipelatch circuits storing data from memory cells via global input/output lines, a pipelatch input control means to selectively couple the pipelatch circuit to the global input/output lines in response to a pipelatch control signal, and a pipe count signal generator to control a data path between the pipelatch circuits and an output driver, wherein the pipelatch input control means comprises: a first control signal generator receiving a first control signal and global input/output line signals and producing a pass gate control signal; a second control signal generator receiving the first control signal and the pass gate control signal and producing a plurality of second control signals; a third control signal generator receiving the pass gate control signal and producing a third control signal by combining the pass gate control signal and a delay signal of the pass gate control signal; and a fourth control signal generator receiving the first control signal, the plurality of second control signals and the third control signal and producing the pipelatch control signal.

In accordance with an aspect of the present invention, there is provided a memory device having a plurality of pipelatch circuits storing data from memory cells via global input/output lines, a pipelatch input controller to selectively couple the pipelatch circuit to the global input/output lines in response to a pipelatch control signal, and a pipe count signal generator to control a data path between the pipelatch circuits and an output driver, wherein the pipelatch input controller comprises: a means for increasing an operation margin of the pipelatch control signal to guarantee complete data transfer from the global input/output lines to the pipelatch circuits.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, the present invention will be described in detail referring to the accompanying drawings.

Figure 1:
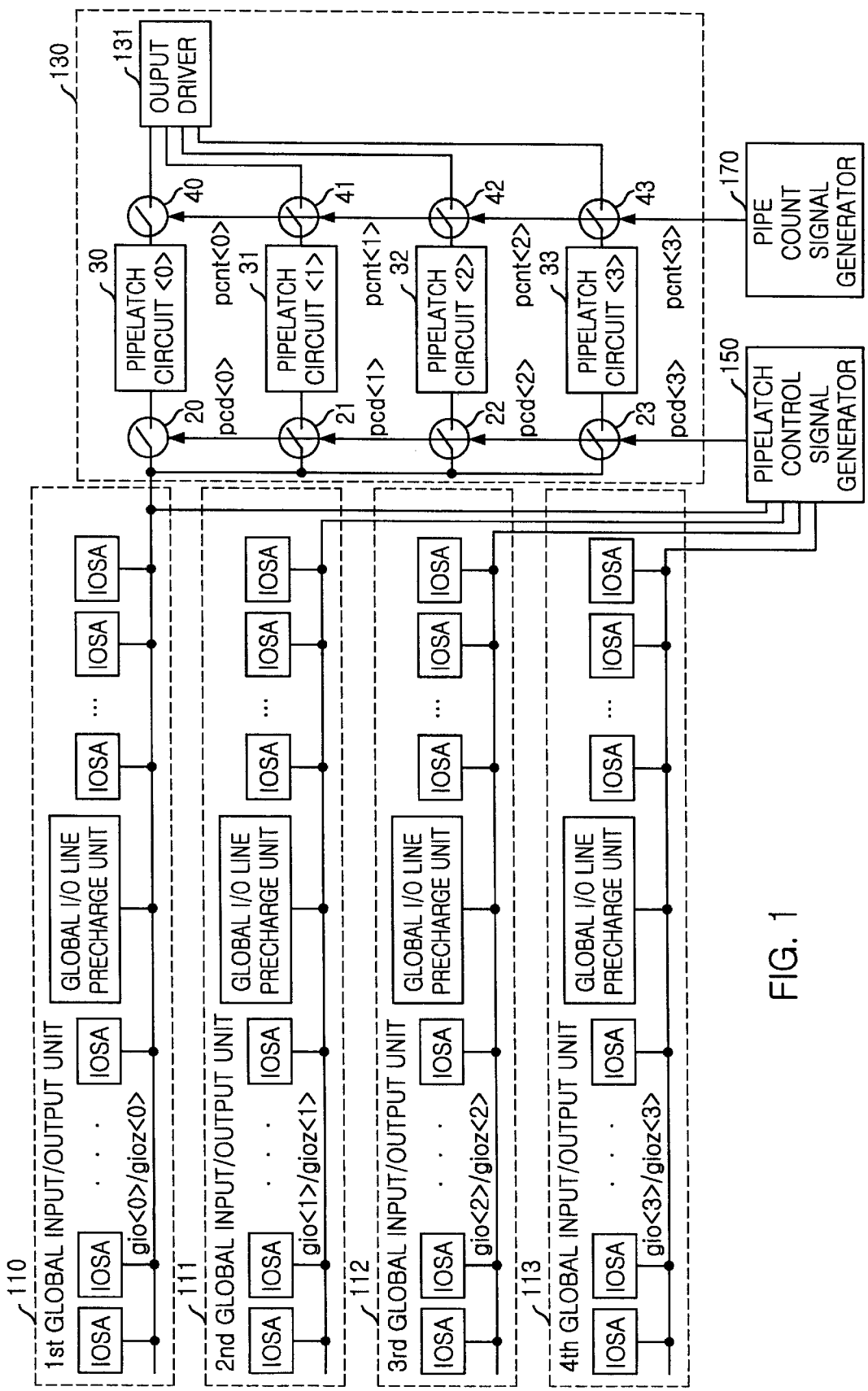
FIG. 1 is a block diagram illustrating a data output path in a wave pipeline in which a plurality of pipelatch circuits temporarily to store cell data are arranged in parallel.
Figure 2:
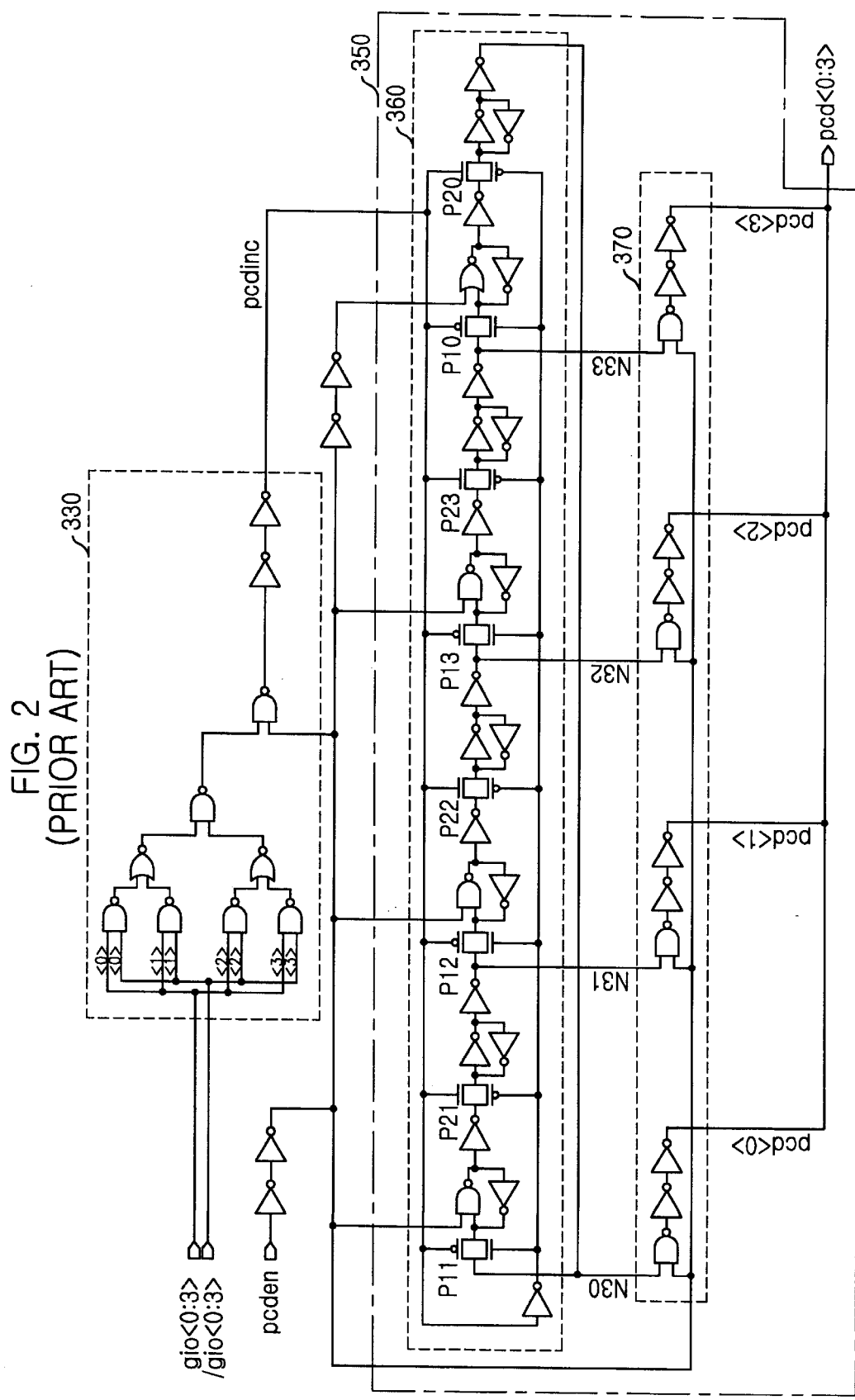
FIG. 2 is a block diagram of a pipelatch control signal generator in FIG. 1.
Figure 3:
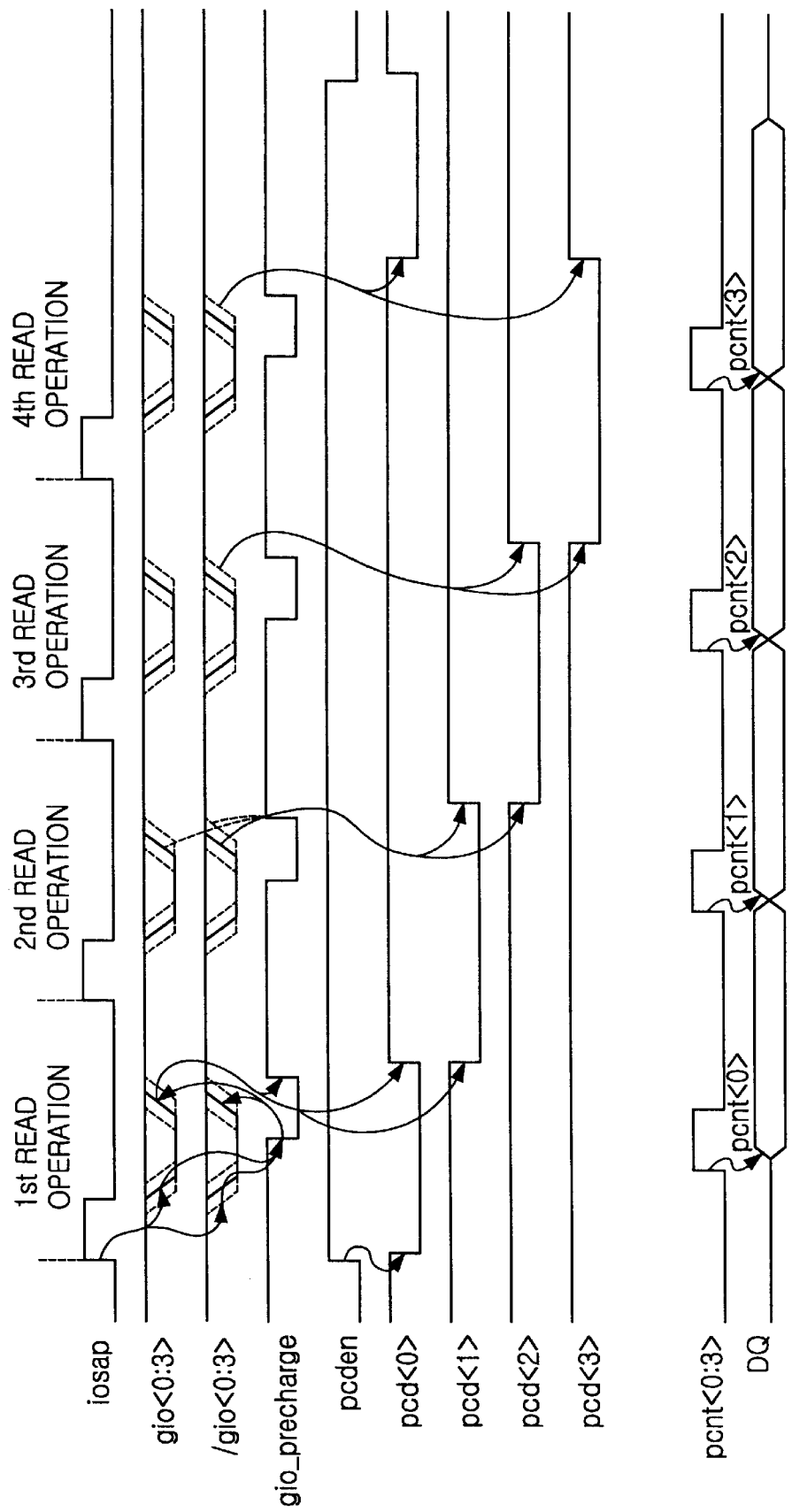
FIG. 3 is a timing chart illustrating the wave pipeline having a plurality of pipelatch circuits in FIG. 1.
Figure 4:
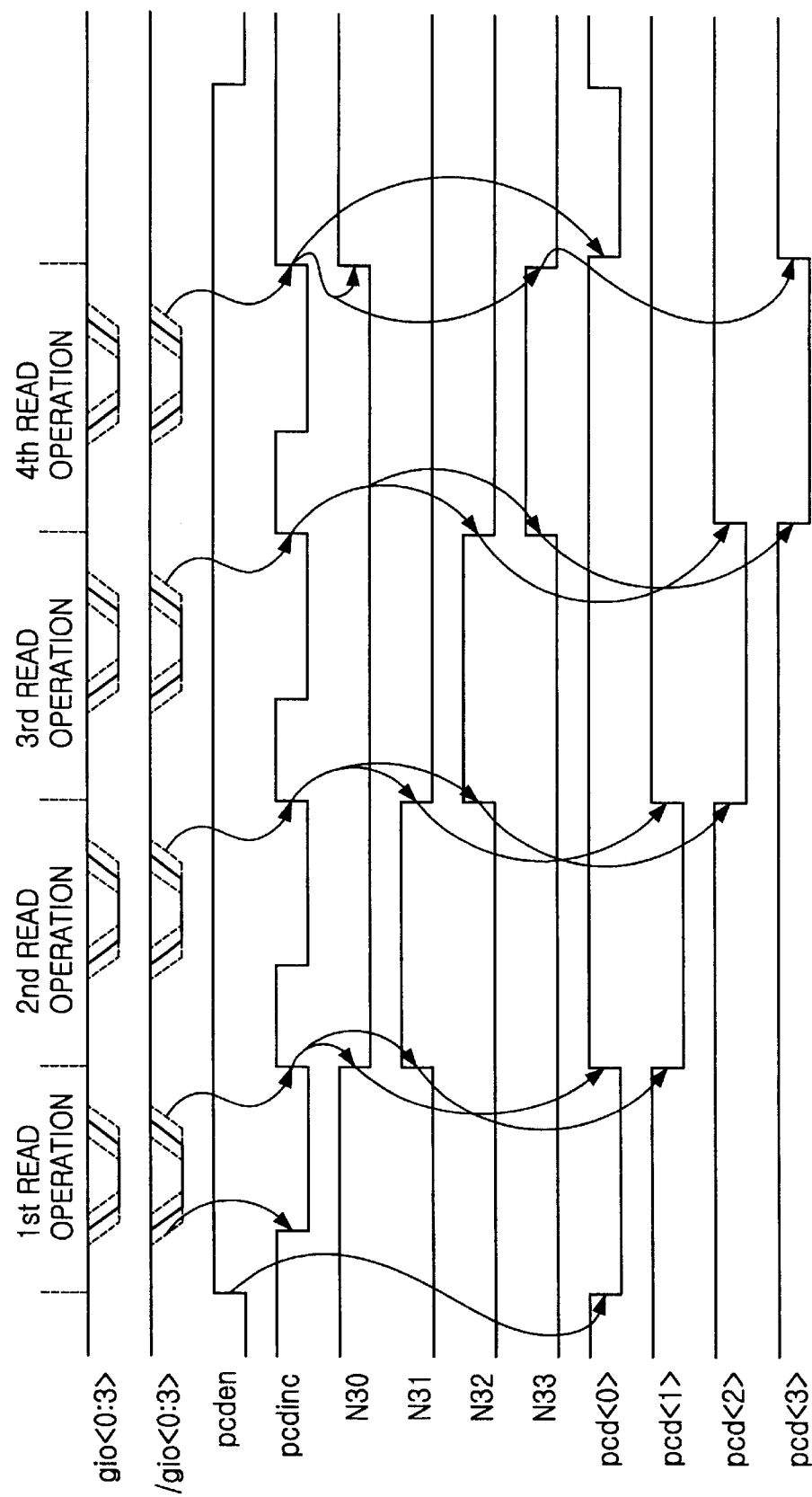
FIG. 4 is a timing chart illustrating the pipelatch control signal generator in FIG. 2.
Figure 5:
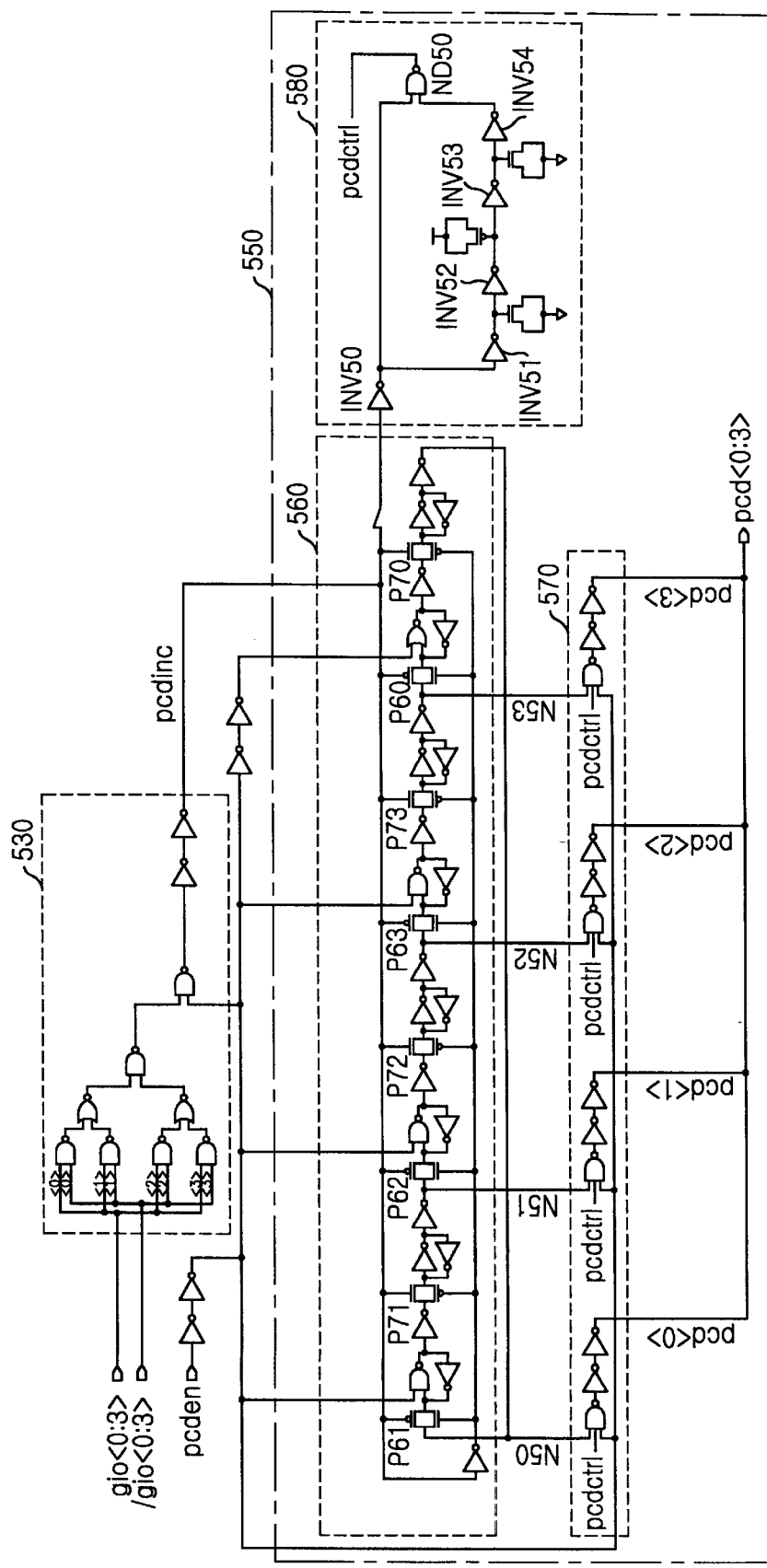
FIG. 5 is a block diagram of a pipelatch control signal generator according to the present invention.

First, FIG. 5 is a block diagram of a pipelatch control signal generator according to the present invention. As shown in FIG. 5, a pipelatch control signal generator 150 according to the present invention includes a pass gate control signal generator 530, which produces a pass gate signal pcdinc by combining global input/output lines signals gio<0:3> and /gio<0:3> and a pipelatch enable signal pcden, and a pipelatch selection signal generator 550 which produces a pipelatch control signal pcd<0>, pcd<1>, pcd<2> or pcd<3> to select one of pipelatch circuits 30 to 33 in FIG. 1 in response to the pass gate signal pcdinc, the pipelatch enable signal pcden and a pipelatch disable control signal pcdctrl.

The pipelatch selection signal generator 550 includes a first circuit unit 560, a second circuit unit 570 and a pipelatch disable control unit 580. The first circuit unit 560 includes first pass transistors P60, P61, P62 and P63 controlled by the pass gate signal pcdinc and second pass transistors P70, P71, P72 and P73 controlled by an inverted signal of the pass gate signal pcdinc. At nodes N50 to N53, output signals of the first circuit unit 560 are produced by latch and buffer circuits which combine the pipelatch enable signal pcden and output signals from the second pass transistors P70, P71, P72 and P73. The second circuit unit 570 outputs the pipelatch control signals pcd<0>, pcd<1>, pcd<2> and pcd<3>, by NANDing the output signals from the first circuit unit 560, the pipelatch enable signal pcden and the pipelatch disable control signal pcdctrl.

The pipelatch disable control unit 580 includes an inverter INV50 for producing an inverted pass gate signal/pcdinc, a delay unit having a plurality of inverters INV51, INV52, INV53 and INV54 and a plurality of PMOS and NMOS transistors for capacitor and a NAND gate ND50 receiving the delayed signal and an output signal from the inverter INV50.

Figure 6:
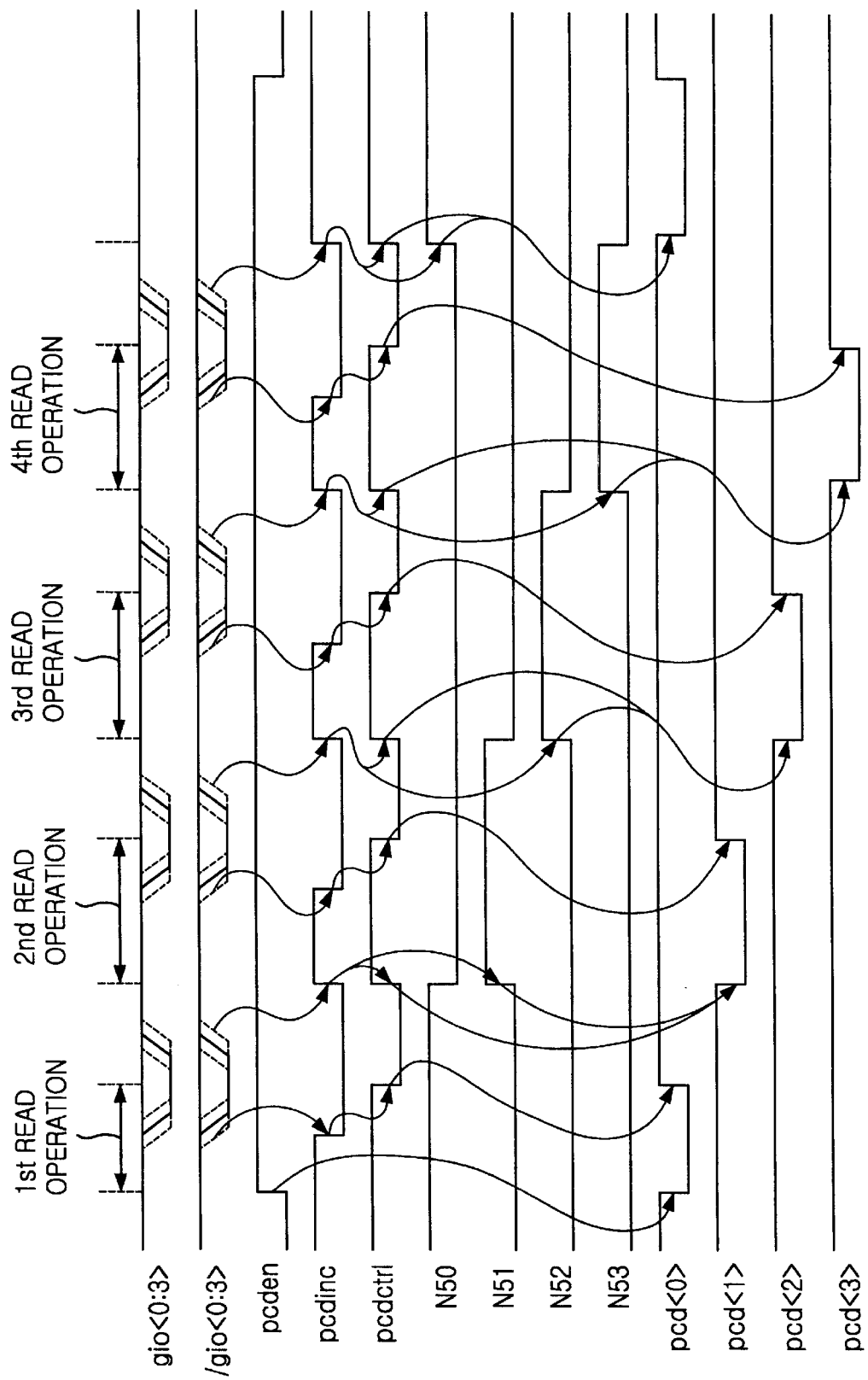
FIG. 6 is a timing chart illustrating the pipelatch control signal generator in FIG. 5.

FIG. 6 is a timing chart illustrating the pipelatch control signal generator according to the present invention.

If the pipelatch enable signal pcden is maintained in a low voltage level before the first read operation is carried out, a signal at node N50 in the pipelatch selection signal generator 550 is in a high voltage level and other signals at nodes N51, N52 and N53 are in a low voltage level. When the first read operation is carried out, the pipelatch enable signal pcden, which is activated in a high voltage level, is applied to the pipelatch selection signal generator 550 and combined with an output signal from the first pass transistors P60. All of the combined signals, the signal at node N50 and the pipelatch disable control signal pcdctrl are in a high voltage level. Accordingly, only the pipelatch control signal pcd<0> is in a low voltage level.

When one of the input/output sense amplifiers (IOSAs) is turned on and one of the global input/output lines gio<0> and /gio<0> goes from a high voltage level to a low voltage level, the pass gate signal pcdinc goes to a low voltage level. The pass gate signal pcdinc having such a low voltage level is applied to the pipelatch disable control unit 580.

On the other hand, the NAND gate ND50 receives the inverted pass gate signal (logic high level) pcdinc by the inverter INV50 and the delayed signal (logic high level) by the inverters and transistors, thereby outputting a low voltage level signal.

When the pipelatch disable control signal pcdctrl goes from a high voltage level to a low voltage level, the first switching means 20 is disabled by the pipelatch control signal pcd<0> which is in a high voltage level. Therefore, the data transmission time, which is formed between the global input/output lines gio<0> and /gio<0> and the pipelatch circuit by the pipelatch control signal pcd<0>, is the same delay time in the pipelatch disable control unit 580. In other words, the pipelatch enable time is determined by the delay time in the pipelatch disable control unit 580 and the delay time enough to transfer the data to the pipelatch circuit is determined based on the farthest input/output sense amplifier. It should be noted that the data transfer is not synchronized with the precharge of the global input/output lines gio<0> and /gio<0>. That is, the global input/output lines gio<0> and /gio<0> are enabled, the data are transferred to the pipelatch circuits 30 to 33, and such a data transfer is disabled after the delay time determined by the pipelatch disable control unit 580. After a predetermined time, one of the global input/output lines gio<0> and /gio<0> goes to a low voltage level and the global input/output line precharge signal gio_precharge, which is activated in a low voltage level, precharges the global input/output lines gio<0> and /gio<0> to a low voltage level.

When the global input/output lines gio<0> and /gio<0> are precharged to a high voltage level, the pass gate signal pcdinc, which is an output from the pipelatch disable control unit 580, is in a high voltage level so that the signal at node N51 and the pipelatch disable control signal pcdctrl are in a high voltage level and the pipelatch control signal pcd<1> in a low voltage level enables the switching means 21 in response to the signal at node N51 and the pipelatch enable signal pcden. The transferred data are output via the output driver 131 in response to the pipe count signal pcnt.

As stated above, in the second read operation, when one of the input/output sense amplifiers (IOSAs) is activated, the pipelatch circuits 31 to 33 store the data in this order.

As apparent from the above, the data transfer through the pipelatch disable control unit according to the present invention prevents an error caused by a data transfer, by disabling the pipelatch circuit after the data are perfectly loaded therein. Accordingly, the present invention improves the reliability of memory devices, by preventing the unstable data bandwidth due to the data skew.

While the present invention has been described with respect to the particular embodiments, it will be apparent to those skilled in the art that various changes and modifications may be made without departing from the scope of the invention as defined in the following claims.

What is claimed is:

1. A memory device having a plurality of pipelatch circuits storing data from memory cells via global input/output lines, a pipelatch input control means to selectively couple the pipelatch circuit to the global input/output lines in response to a pipelatch control signal, and a pipe count signal generator to control a data path between the pipelatch circuits and an output driver, wherein the pipelatch input control means comprises:

a first control signal generator receiving a first control signal and global input/output line signals and producing a pass gate control signal;

a second control signal generator receiving the first control signal and the pass gate control signal and producing a plurality of second control signals;

a third control signal generator receiving the pass gate control signal and producing a third control signal by combining the pass gate control signal and a delay signal of the pass gate control signal; and a fourth control signal generator receiving the first control signal, the plurality of second control signals and the third control signal and producing the pipelatch control signal.

2. The memory device in accordance with claim 1, wherein the third control signal generator comprises:

an inverting means for inverting the pass gate control signal;

a delay means for delaying the inverted pass gate control signal; and a logic circuit for NANDing the inverted pass gate control signal and the delayed pass gate control signal.

3. The memory device in accordance with claim 2, wherein the delay means comprises:

even numbers of inverters for delaying the inverted pass gate control signal; and a plurality of MOS transistors connected as capacitors, being coupled to the inverters.

4. A memory device having a plurality of pipelatch circuits storing data from memory cells via global input/output lines, a pipelatch input controller to selectively couple the pipelatch circuit to the global input/output lines in response to a pipelatch control signal, and a pipe count signal generator to control a data path between the pipelatch circuits and an output driver, wherein the pipelatch input controller comprises:

a means for increasing an operation margin of the pipelatch control signal to guarantee complete data transfer from the global input/output lines to the pipelatch circuits.

5. The memory device in accordance with claim 4, wherein the means comprises a delayer for delaying a control signal which is produced by using global input/output line signals and a pipelatch enable signal.

* * * * *